United States Patent
Tung et al.

(10) Patent No.: US 8,249,441 B2
(45) Date of Patent: Aug. 21, 2012

(54) ZINC OXIDE NANO-WIRE BASED ACTUATOR, LENS MODULE USING SAME AND CAMERA MODULE USING SAME

(75) Inventors: Tsai-Shih Tung, Taipei Hsien (TW); Hsin-Chin Hung, Taipei Hsien (TW); Chuan-De Huang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 911 days.

(21) Appl. No.: 12/327,613

(22) Filed: Dec. 3, 2008

(65) Prior Publication Data

US 2009/0290865 A1 Nov. 26, 2009

(30) Foreign Application Priority Data

May 21, 2008 (CN) .......................... 2008 1 0301690

(51) Int. Cl.
*G03B 3/10* (2006.01)
(52) U.S. Cl. ....................................... 396/133
(58) Field of Classification Search .................. 396/529, 396/133

See application file for complete search history.

(56) References Cited

U.S. PATENT DOCUMENTS

| | | | |
|---|---|---|---|
| 2006/0140609 A1* | 6/2006 | Chen | 396/85 |
| 2006/0140610 A1* | 6/2006 | Chang | 396/89 |
| 2007/0076304 A1* | 4/2007 | Chen | 359/721 |
| 2010/0117488 A1* | 5/2010 | Wang et al. | 310/339 |

FOREIGN PATENT DOCUMENTS

| | | |
|---|---|---|
| CN | 1707302 A | 12/2005 |
| CN | 101009214 A | 8/2007 |

* cited by examiner

*Primary Examiner* — Clayton E Laballe
*Assistant Examiner* — Dennis Hancock
(74) *Attorney, Agent, or Firm* — Altis Law Group, Inc.

(57) ABSTRACT

An exemplary zinc oxide nano-wire based actuator includes a first electrode, a second electrode opposite to the first electrode, and a zinc oxide nano-wire layer sandwiched between the first electrode and the second electrode. The zinc oxide nano-wire layer includes two opposite surfaces in contact with the first and the second electrodes respectively, and a plurality of zinc oxide nano-wires substantially parallel to each other. The first electrode and the second electrode are configured for cooperatively creating therebetween an electric field with an electric field direction substantially parallel to the zinc oxide nano-wires so as to adjust a thickness of the zinc oxide nano-wire layer, thereby moving the second electrode relative to the first electrode.

5 Claims, 5 Drawing Sheets

_US 8,249,441 B2_

ZINC OXIDE NANO-WIRE BASED ACTUATOR, LENS MODULE USING SAME AND CAMERA MODULE USING SAME

CROSS-REFERENCE TO RELATED APPLICATIONS

This application is related to the commonly-assigned copending application Ser. No. 12/274,490, entitled "CNT-BASED ACTUATOR, LENS MODULE USING SAME AND CAMERA MODULE USING SAME", filed on Nov. 20, 2008. The Disclosure of the above-identified application is incorporated herein by reference.

BACKGROUND

1. Technical Field

The present invention relates to actuators, and particularly to a zinc oxide nano-wire based actuator.

2. Description of Related Art

Camera modules use actuators to achieve a zooming or auto-focusing function. Typical actuators include, for example, stepper motors. When employing such actuators, it is usually necessary to use a gear assembly to transform the rotational movement of the actuators into a linear movement. However, the existence of the gear assembly generally renders the camera modules to be unduly bulky. Furthermore, the occurrence of backlash/recoil in the gear assembly may result in degraded focusing accuracy.

Therefore, a new actuator is desired to overcome the above mentioned problems.

SUMMARY

An exemplary zinc oxide nano-wire based actuator includes a first electrode, a second electrode opposite to the first electrode, and a zinc oxide nano-wire layer sandwiched between the first electrode and the second electrode. The zinc oxide nano-wire layer includes two opposite surfaces in contact with the first and the second electrodes respectively, and a plurality of zinc oxide nano-wires substantially parallel to each other. The first electrode and the second electrode are configured for cooperatively creating an electric field therebetween with an electric field direction substantially parallel to the zinc oxide nano-wires so as to adjust a thickness of the zinc oxide nano-wire layer, thereby moving the second electrode relative to the first electrode.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE EMBODIMENTS

Embodiments will now be described in detail below with reference to the drawings.

Figure 1:
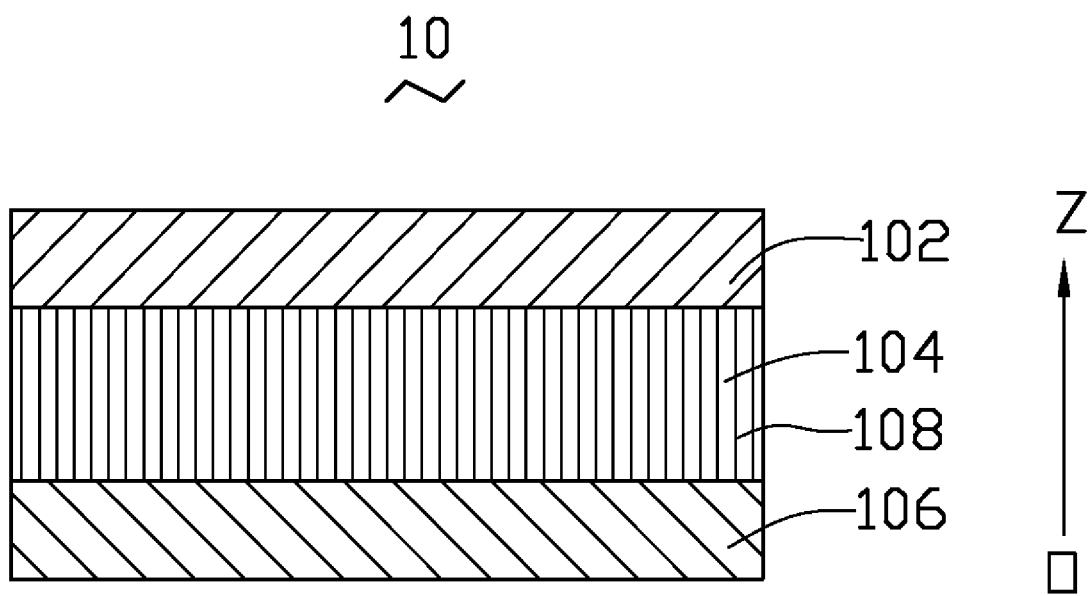
FIG. 1 is a schematic, side cross-sectional view of a zinc oxide nano-wire based actuator in accordance with a first embodiment.

Referring to FIG. 1, a zinc oxide nano-wire based actuator 10 is shown. The actuator includes a first electrode 102, a second electrode 106, and a zinc oxide nano-wire layer 104 sandwiched between the first electrode 102 and the second electrode 106. The zinc oxide nano-wire layer 104 includes a first surface and an opposite second surface. The first and the second surfaces contact with the first electrode 102 and the second electrode 106, respectively. The zinc oxide nano-wire layer 104 includes a plurality of zinc oxide nano-wires 108.

When a voltage is applied to the first electrode 102 and the second electrode 106, an electric field is formed therebetween. In the present embodiment, the first electrode 102 and the second electrode 106 are plate electrodes with a planar surface facing each other. The direction of the electric field at any given point between the electrodes 102, 106 is substantially perpendicular to the surface of the first electrode 102. That is, the direction of the electric field is substantially parallel to the Z axis. The zinc oxide nano-wires 108 undergo an electrostrictive deformation under the electric field. Hence, the zinc oxide nano-wire layer 104 extends along the Z axis, and then drives the first electrode 102 to move away from the second electrode 106. When the second electrode 106 is fixed, the zinc oxide nano-wire layer 104 drives the first electrode 102 to move away from the second electrode 106 along a positive direction of the Z axis (i.e., a direction of the arrow). When the voltage is removed from the first and second electrodes 102, the zinc oxide nano-wire layer 104 restores to an initial thickness, and the first electrode 102 returns to an original position relative to the second electrode 106.

The voltage can be in an approximate range from 0.1 Voltages (V) to 100 V, and particularly in an approximate range from 0.5 V to 4 V The amount of elongation of the zinc oxide nano-wire based actuator 10 can be in an approximate range from 50 µm to 500 µm, and, particularly in an approximate range from 100 µm-400 µm. In other words, the distance the first electrode 102 moves relative to the second electrode 106 is in an approximate range from 50 µm to 500 µm. In the present embodiment, the elongation range of the zinc oxide nano-wire based actuator 10 is from 100 µm-400 µm.

The first electrode 102 and the second electrode 106 can be made of a material selected from a group consisting of aluminum, copper, silver, copper aluminum alloy, and silver copper alloy. The thickness of the zinc oxide nano-wire layer 104 is in an approximate range from 0.1 millimeters to 10 centimeters. The zinc oxide nano-wire layer 104 can be a single layer of zinc oxide nano-wire array or a plurality of stacked layers of zinc oxide nano-wire array. In the present embodiment, the zinc oxide nano-wire layer 104 is a single layer of zinc oxide nano-wire array. A central axis of the zinc oxide nano-wire 108 is substantially perpendicular to the surface of the first electrode 102, and substantially parallel to the Z axis. The zinc oxide nano-wire 108 has a radius of approximate range from 50 nanometers to 150 nanometers. The zinc oxide nano-wire 108 has a high elastic modulus. Accordingly, the reliability of the zinc oxide nano-wire based actuator 10 is high.

A method for making the zinc oxide nano-wire based actuator 10 is also provided.

Firstly, a zinc oxide nano-wire array is grown on the substrate. Secondly, the zinc oxide nano-wire array is pulled off from the substrate using a pulling tool (e.g., a tweezer). Thirdly, the zinc oxide nano-wire array is directly disposed on the surface of the first electrode 102, thus forming the zinc oxide nano-wire layer 104. Finally, the second electrode 106 is placed directly on a surface of the zinc oxide nano-wire layer 104 opposite to the first electrode 102, and pressed hard towards the first electrode 102.

Figure 2:
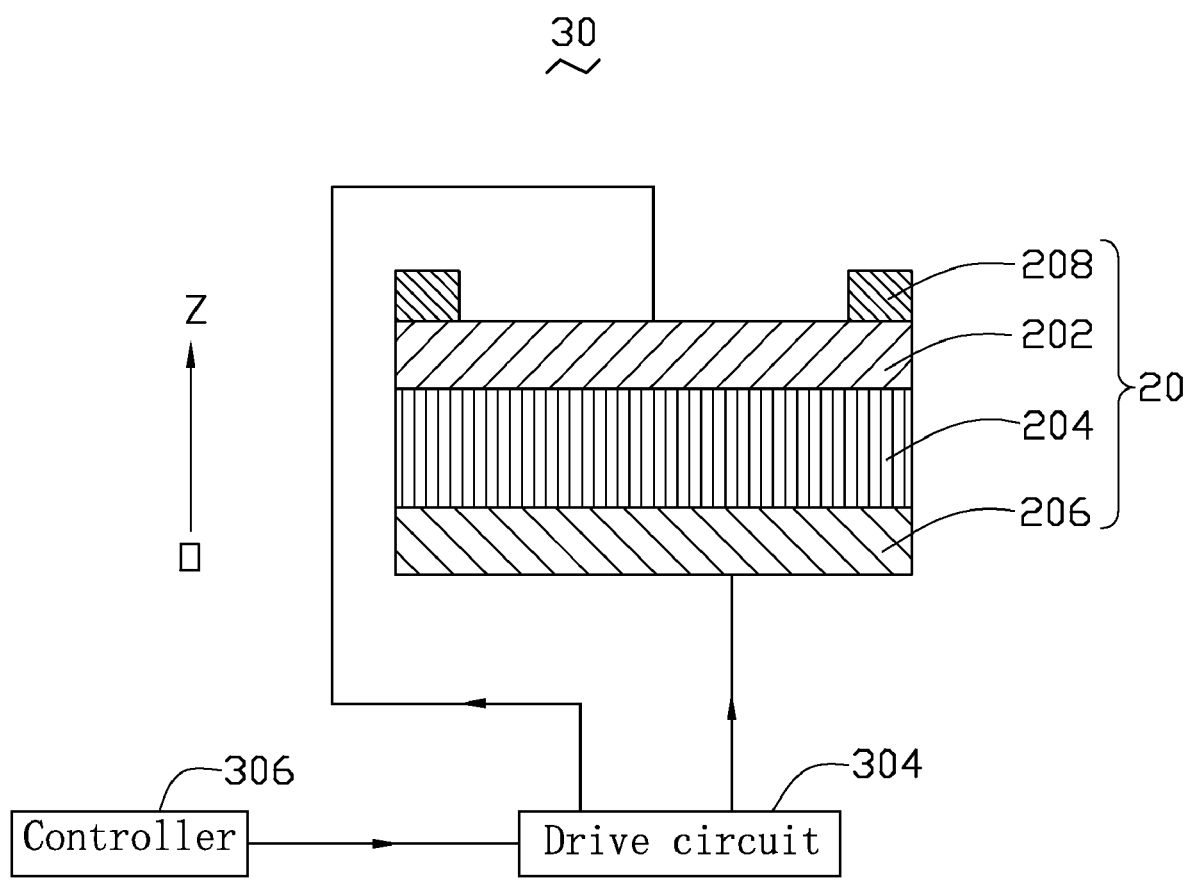
FIG. 2 is a schematic view of a zinc oxide nano-wire based actuator system in accordance with a second embodiment.

Referring to FIG. 2, a zinc oxide nano-wire based actuator system 30 according to a second embodiment includes a zinc oxide nano-wire based actuator 20, a drive circuit 304, and a controller 306.

The zinc oxide nano-wire based actuator 20 includes a first electrode 202, a second electrode 206, a zinc oxide nano-wire layer 204 sandwiched between the first electrode 202 and the second electrode 206, two actuator heads 208 formed on the first electrode 202.

An input of the drive circuit 304 is electrically connected with the controller 306, and is configured for receiving a control signal from the controller 306. An output of the drive circuit 304 is electrically connected with the first electrode 202 and the second electrode 206, respectively. The drive circuit 304 is configured for applying a direct voltage to the first electrode 202 and the second electrode 206.

In operation, when the second electrode 206 is fixed, the controller 306 sends a control signal to the drive circuit 304 based on a distance that the first electrode (or the actuator heads 208) needs to move. In response to the control signal, the drive circuit 304 applies a voltage to the first electrode 202 and the second electrode 206. The voltage generates an electric field between the first electrode 202 and the second electrode 206. Then the zinc oxide nano-wire layer 204 extends along the Z axis, and drives the first electrode 202 and the actuator head 208 to move a predetermined distance along the Z axis.

Figure 3:
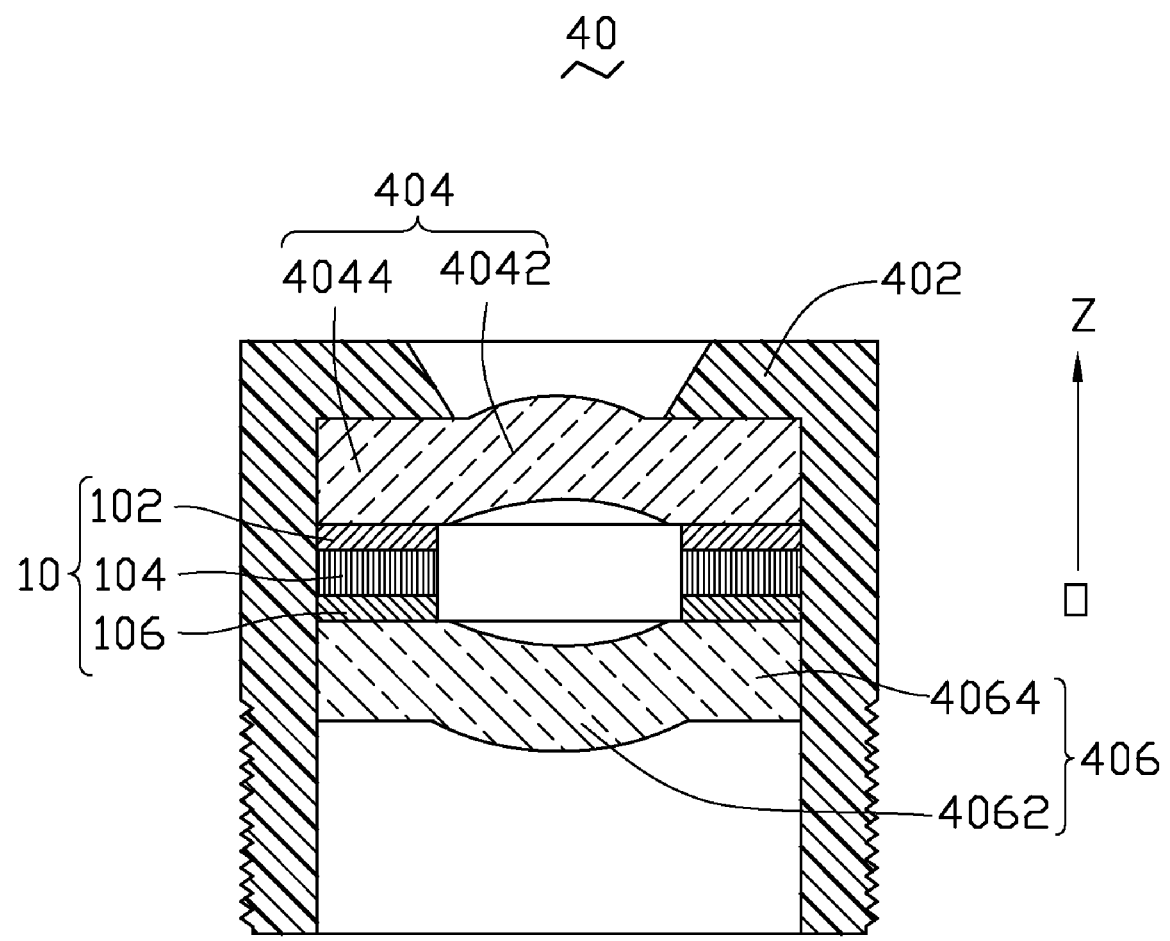
FIG. 3 is a schematic, side cross-sectional view of a lens module in accordance with a third embodiment.

Referring to FIG. 3, a lens module 40 according to a third embodiment is shown. The lens module 40 includes a barrel 402, a first lens 404, a plurality of zinc oxide nano-wire based actuators 10, and a second lens 406. The first lens 404 is secured in the barrel 402, and the second lens 406 is movably disposed in the barrel 402. The first lens 404 includes a first optically active part 4042 and a first optically inactive part 4044 surrounding the first active part 4042. The second lens 406 includes a second optically active part 4062 and a second optically inactive part 4064 surrounding the second optically active part 4062. The zinc oxide nano-wire based actuators 10 are symmetrically arranged between the first optically inactive part 4044 and the second optically inactive part 4064. The first electrode 102 and the second electrode 106 are firmly connected with first optically inactive part 4044 and the second optically inactive part 4064 respectively. The zinc oxide nano-wire based actuator 10 is configured for driving the second lens 406 to move away from the first lens 404 along a negative direction of the Z axis (i.e., a reverse direction of the arrow), adjusting a distance between the first lens 404 and the second lens 406, thus achieving a zooming function.

Figure 4:
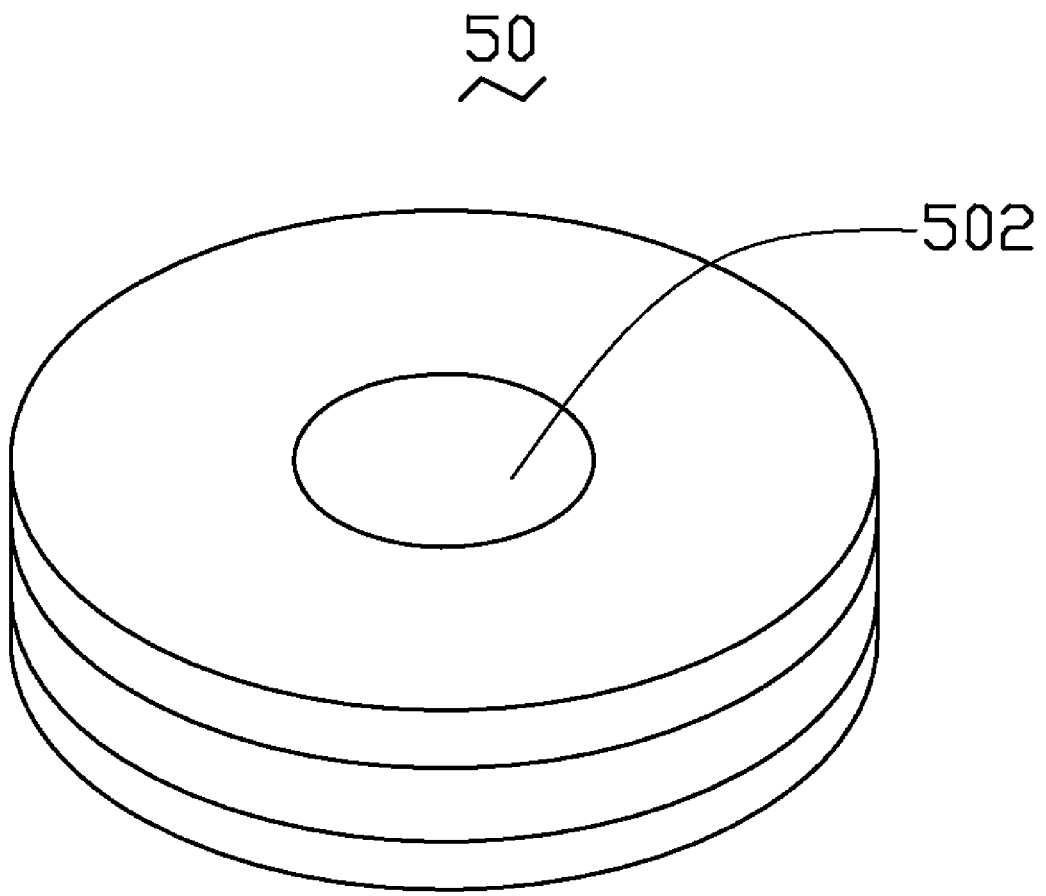
FIG. 4 is a schematic, perspective view of a zinc oxide nano-wire based actuator in accordance with a fourth embodiment.

In the third embodiment, the lens module 40 employs a plurality of zinc oxide nano-wire based actuators 10. Alternatively, the lens module 40 can use a single zinc oxide nano-wire based actuator 50 shown in FIG. 4. The zinc oxide nano-wire based actuator 50 is similar to the zinc oxide nano-wire based actuator 10, except that the zinc oxide nano-wire based actuator 50 is annular with a through hole 502 defined therein. The outer diameter of the zinc oxide nano-wire based actuator 50 is less than or equal to the inner diameter of the barrel 402. The through hole 502 aligns with the first optically active part 4042 and the second optically active part 4062. The through hole 502 allows light passing therethrough.

The zinc oxide nano-wire based actuator 10 performs a linear movement. Therefore, there is no need to use a gear assembly to convert a rotation movement to a linear movement. Furthermore, the occurrence of backlash/recoil in the gear assembly is eliminated.

Figure 5:
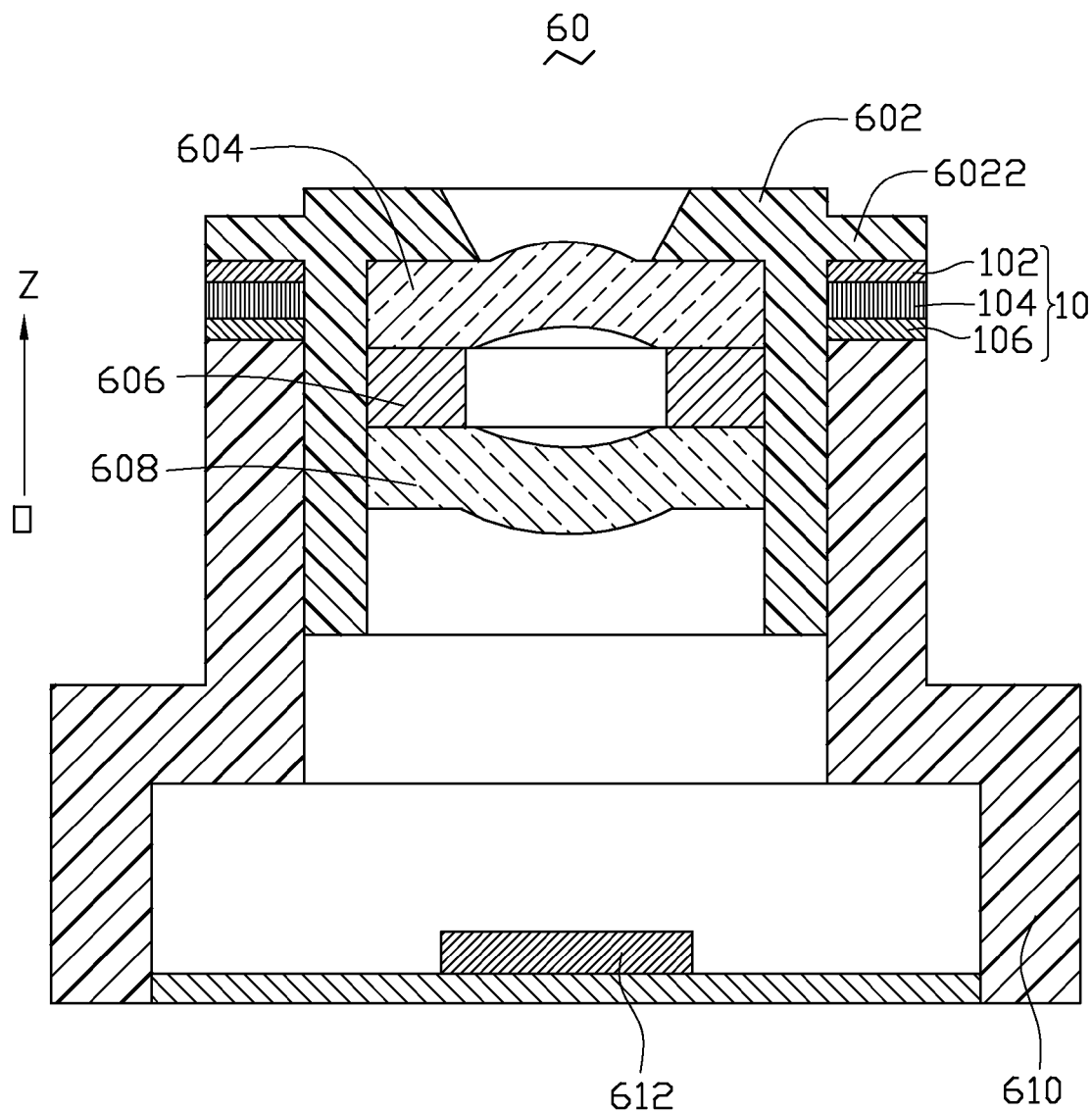
FIG. 5 is a schematic, side cross-sectional view of a camera module in accordance with a first embodiment.

Referring to FIG. 5, a camera module 60 according to a fifth embodiment is shown. The camera module 60 includes a barrel 602, a first lens 604, a spacer 606, a second lens 608, a plurality of zinc oxide nano-wire based actuator 10, a holder 610, and an image sensor 612. The first lens 604, the spacer 606 and the second lens 608 are sequentially received in the barrel 602, and cooperatively form a lens module with the barrel 602. The barrel 602 has an annular flange 6022 extending outward from an outer surface of a sidewall thereof. The image sensor 612 is received in the holder 610. Each zinc oxide nano-wire based actuator 10 is sandwiched between one end of the holder 610 and the annular flange 6022. The first electrode 102 and the second electrode 106 are firmly connected to the annular flange 6022 and the end of the holder 610. The zinc oxide nano-wire based actuator 10 is configured for driving the lens module to move along the positive direction of the Z axis, and adjusting a distance between the lens module and the image sensor 612, thus achieving an auto-focusing function.

In the above fifth embodiment, the camera module 60 includes a plurality of zinc oxide nano-wire based actuators 10. Alternatively, the camera module can adopt a single zinc oxide nano-wire based actuator similar to the zinc oxide nano-wire based actuator 50. In this case, the inner diameter of the zinc oxide nano-wire based actuator should be larger than or equal to the outer diameter of the barrel 602, and the barrel 602 is nested in the zinc oxide nano-wire based actuator.

While certain embodiments have been described and exemplified above, various other embodiments from the foregoing disclosure will be apparent to those skilled in the art. The present invention is not limited to the particular embodiments described and exemplified but is capable of considerable variation and modification without departure from the scope of the appended claims.

What is claimed is:

1. A lens module comprising:
   a barrel;
   a first lens fixedly disposed in the barrel, the first lens comprising a first optically active part and a first optically inactive part surrounding the first optically active part;
   a second lens movably received in the barrel, the second lens comprising a second optically active part and a second optically inactive part surrounding the second optically active part; and
   a zinc oxide nano-wire based actuator sandwiched between the first and the second optically inactive parts, the zinc oxide nano-wire based actuator comprising:
   a first electrode;
   a second electrode opposite to the first electrode; and
   a zinc oxide nano-wire layer sandwiched between the first electrode and the second electrode, the zinc oxide nano-wire layer comprising two opposite surfaces respectively in contact with the first and the second electrodes and a plurality of zinc oxide nano-wires substantially parallel to each other, wherein the first electrode and the second electrode are configured for cooperatively creating an electric field therebetween with an electric field direction thereof substantially parallel to the zinc oxide nano-wires so as to adjust a thickness of the zinc oxide nano-wire layer, thereby moving the second electrode relative to the first electrode.

2. The lens module as claimed in claim 1, wherein the zinc oxide nano-wire based actuator is annular with a through hole defined therein, and the through hole aligns with the first optically active part and the second optically active part.

3. The lens module as claimed in claim 1, wherein the first and the second electrodes are fixedly connected with the first and the second optically inactive part respectively.

4. The zinc oxide nano-wire based actuator as claimed in claim 1, wherein the zinc oxide nano-wire layer is a single layer of a zinc oxide nano-wire array.

5. The zinc oxide nano-wire based actuator as claimed in claim 1, wherein the zinc oxide nano-wire layer is a plurality of stacked layers of zinc oxide nano-wire arrays.

* * * * *